(12) United States Patent
Tanihira

(10) Patent No.: US 10,020,728 B2
(45) Date of Patent: Jul. 10, 2018

(54) SIGNAL GENERATION DEVICE AND METHOD FOR CONTROLLING OUTPUT VOLTAGE OF REGULATOR

(71) Applicant: MegaChips Corporation, Osaka (JP)

(72) Inventor: Izuho Tanihira, Chiba (JP)

(73) Assignee: MegaChips Corporation, Osaka (JP)

( * ) Notice: Subject to any disclaimer, the term of this patent is extended or adjusted under 35 U.S.C. 154(b) by 0 days.

(21) Appl. No.: 15/465,772

(22) Filed: Mar. 22, 2017

(65) Prior Publication Data

US 2017/0279353 A1  Sep. 28, 2017

(30) Foreign Application Priority Data

Mar. 23, 2016  (JP) ................. 2016-058747

(51) Int. Cl.

| H02M 3/157 | (2006.01) |
|---|---|
| H02M 1/08 | (2006.01) |
| H03K 5/14 | (2014.01) |
| H02M 1/00 | (2006.01) |
| H03K 5/00 | (2006.01) |

(52) U.S. Cl.
CPC .............. *H02M 3/157* (2013.01); *H02M 1/08* (2013.01); *H03K 5/14* (2013.01); *H02M 2001/0012* (2013.01); *H03K 2005/00078* (2013.01)

(58) Field of Classification Search
CPC .......... H02M 3/157; H02M 1/08; H03K 5/14; H03K 2005/00078
See application file for complete search history.

(56) References Cited

U.S. PATENT DOCUMENTS

| 6,956,395 | B2* | 10/2005 | Oshima | G01R 31/31922 324/73.1 |
|---|---|---|---|---|
| 7,512,858 | B2* | 3/2009 | Rivoir | G01R 31/31709 714/744 |
| 8,466,701 | B2* | 6/2013 | Kojima | H02M 3/1584 324/750.3 |
| 8,558,727 | B2 | 10/2013 | McGowan | |
| 8,933,716 | B2* | 1/2015 | Ishida | G01R 31/31721 324/702 |
| 9,041,421 | B2* | 5/2015 | Peng | G01R 31/2884 324/750.01 |

(Continued)

FOREIGN PATENT DOCUMENTS

| JP | H11-355113 A | 12/1999 |
|---|---|---|
| JP | 2014-513908 A | 6/2014 |

*Primary Examiner* — Emily P Pham
(74) *Attorney, Agent, or Firm* — Osha Liang LLP

(57) ABSTRACT

A signal generation device outputs a signal based on a predetermined pattern with a logic transition to a predetermined external device. The signal generation device comprises an output driver which outputs respective signals based on at least two test patterns different in the frequency of the logic transition respectively to the predetermined external device, a regulator which supplies power to the output driver, a current compensation circuit which generates a compensation current, and a control circuit which adjusts a value of the compensation current. The control circuit adjusts, for each test pattern, the value of the compensation current such that a difference value calculated based on output voltages of the regulator becomes a determination criteria value or less.

14 Claims, 13 Drawing Sheets

(56) References Cited

U.S. PATENT DOCUMENTS

| | | | |
|---|---|---|---|
| 2009/0287431 A1* | 11/2009 | Suda | G01R 31/31924 702/58 |
| 2012/0086462 A1* | 4/2012 | Ishida | G01R 31/31721 324/601 |
| 2013/0229197 A1* | 9/2013 | Kusaka | G01R 31/2832 324/750.01 |

* cited by examiner

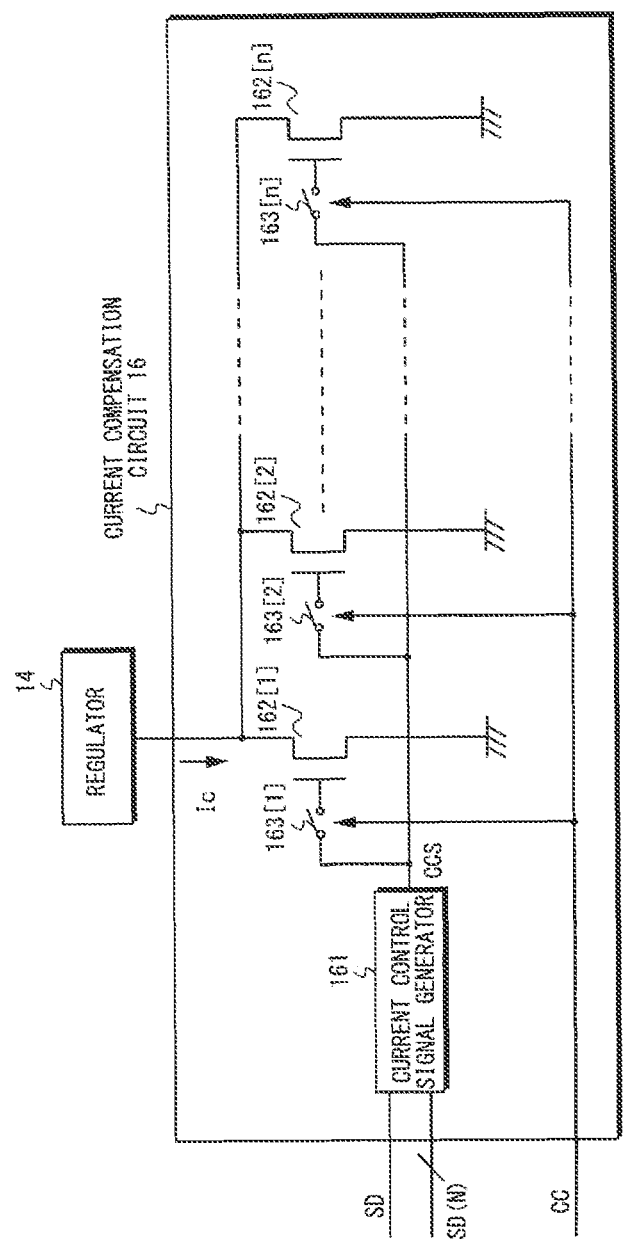

Timing Chart

Timing Chart

Timing Chart

Timing Chart

SIGNAL GENERATION DEVICE AND METHOD FOR CONTROLLING OUTPUT VOLTAGE OF REGULATOR

BACKGROUND OF THE INVENTION

Field of the Invention

The present invention relates to a signal generation device and a method for controlling an output voltage of a regulator.

Background Art

A high speed communication as having a data transfer rate in a high frequency (e.g., GHz) band has recently been performed. A transmitter or the like which realizes such a high speed communication needs to suppress jitter in order to avoid deterioration in communication quality.

The jitter may typically occur due to a fluctuation in output voltage of a regulator used in a signal generation device which outputs a signal to the transmitter or the like. Therefore, the signal generation device needs to suppress the fluctuation in the output voltage of the regulator to be used.

As a technique for suppressing a fluctuation in voltage, for example, Patent Document 1 (Japanese Patent Application Publication No. 2014-513908) discloses a configuration that a compensation type current cell is provided for a current source. Such a compensation type current cell is equipped with first and second switching transistors respectively configured to switch an input current between first and second outputs, based on first and second input signals, a first compensation type transistor connected to the first input signal to provide a first compensation type current connected to the second output, and a second compensation type transistor connected to the second input signal to provide a second compensation type current connected to the first output. The first and second compensation type transistors respectively have source terminals connected to each other.

Further, for example, Patent Document 2 (Japanese Patent Application Publication No. H11(1999)-355113) discloses a configuration equipped with a compensation voltage generation circuit which in order to reduce an error between output voltages of an odd number of analog inversion amplifier circuits connected in series, generates a compensation voltage being the same voltage as a refresh voltage generated in the output of each analog inversion amplifier circuit upon refreshing of the inversion amplifier circuit, and a compensating means which compensates the output of the single inversion amplifier circuit as an amplifier circuit, using the compensation voltage.

SUMMARY OF THE INVENTION

In the above-described signal generation device, the load of the regulator to be used changes with time according to the frequency of a logic transition of the signal outputted to the transmitter or the like, and the fluctuation in the output voltage of the regulator occurs. That is, in such a signal generation device, the fluctuation amount of the output voltage of the regulator changes with time.

On the other hand, the configurations disclosed in Patent Documents 1 and 2 do not compensate the voltage changed in its fluctuation amount with time such as described above. Thus, the configurations disclosed in Patent Documents 1 and 2 are not respectively capable of suppressing the fluctuation in the output voltage of the regulator used in the signal generation device.

Therefore, the present invention aims to provide a signal generation device capable of suppressing a fluctuation in output voltage of a regulator to be used, and a method for suppressing the fluctuation in the output voltage of the regulator.

The present invention for solving the above-described problems is configured to include technical features in matters specifying the invention and/or the like shown below.

That is, the invention according to an aspect may be a signal generation device which outputs a signal based on a predetermined pattern with a logic transition to a predetermined external device. The signal generation device may comprise an output driver which outputs respective signals based on at least two test patterns different in the frequency of the logic transition respectively to the predetermined external device, a regulator which supplies power to the output driver, and a current compensation circuit which generates a compensation current. The signal generation device may measure output voltages of the regulator for each of test patterns, and adjust a value of the compensation current such that a difference value between the measured output voltages becomes a determination criteria value or less.

The signal generation device may further comprise a control circuit which determines a value of a current code based on the difference value. The current compensation circuit may generate a current control signal for each test pattern and change the current control signal according to the value of the current code to enable the value of the compensation current to be adjusted.

The signal generation device may further comprise a low-pass filter which determines, for test pattern, average values of the output voltages of the regulator over periods during which the output driver outputs, for each test pattern, the signals based thereon, and a comparison circuit which determines a difference between two of the average values to calculate the difference value and compares the difference value and the determination criteria value. When the difference value exceeds the determination criteria value in the comparison circuit, the control circuit may change the value of the current code.

In addition, the signal generation device may further comprise a delay circuit which delays each of the test patterns by a predetermined clock to generate a delayed test pattern. The current compensation circuit may generate the current control signal based on the test pattern and the delayed test pattern. The output driver may generate a signal outputted to the predetermined external device based on the test pattern and the delayed test pattern.

Further, the current compensation circuit may determine the NOT of EXOR of the test pattern and the delayed test pattern to generate the current control signal.

Furthermore, the signal generation device may further comprise a delay circuit which delays the test pattern by a predetermined clock to generate a delayed test pattern. The delay circuit may generate a plurality of the delayed test patterns different in the number of delay clocks. The current compensation circuit may generate the current control signal based on the test pattern and a plurality of the delayed test patterns. The output driver may generate a signal to be outputted to the predetermined external device based on the test pattern and each of the delayed test patterns.

Still further, the signal generation device may further comprise a delay circuit which delays the test pattern by a predetermined clock to generate a delayed test pattern. The current compensation circuit may generate the current control signal based on the test pattern, the delayed test pattern, and an arbitrary pattern in which a logic transition is arbitrarily performed. The output driver may generate a signal outputted to the predetermined external device based on the test pattern and the delayed test pattern.

Still further, the signal generation device may further comprise a delay adjustment circuit which adjusts delay amounts of the test pattern and the delayed test pattern respectively received by the output driver and the current compensation circuit. The delay adjustment circuit may adjust the delay amounts of the test pattern and the delayed test pattern to correct a difference in internal processing speed between the output driver and the current compensation circuit.

Still further, the invention according to another aspect may be a signal generation device which outputs a signal based on a predetermined pattern with a logic transition to a predetermined external device. The signal generation device may comprise an output driver which outputs a signal based on a test pattern to the predetermined external device, a regulator which supplies power to the output driver, and a current compensation circuit which generates a compensation current. The signal generation device may measure an output voltage of the regulator and adjust a value of the compensation current such that a difference value between the value of the measured output voltage and the value of a predetermined reference voltage becomes a determination criteria value or less.

Still further, the invention according to another aspect may he a method for controlling an output voltage of a regulator supplying power to an output driver in a signal generation device. The signal generation device may output a signal based on a predetermined pattern with a logic transition from the output driver to a predetermined external device. The method may include outputting respective signals based on at least two test patterns different in the frequency of the logic transition respectively from the output driver to the predetermined external device, calculating the output voltages of the regulator every test patterns, and adjusting a value of a compensation current generated by a current compensation circuit such that a difference value between the calculated output voltages becomes a determination criteria value or less.

According to the present invention, a signal generation device and a method for controlling an output voltage of a regulator may allow a fluctuation in the output voltage of the regulator to be suppressed.

Other technical features, objects and operative effects, and advantages of the present invention will become apparent from the following embodiments described with reference to the accompanying drawings.

BRIEF DESCRIPTION OF THE DRAWINGS

FIG. 2 is a block diagram for illustrating a current compensation circuit of a signal generation device according to an embodiment of the present invention;

DESCRIPTION OF THE EMBODIMENTS

Figure 1:
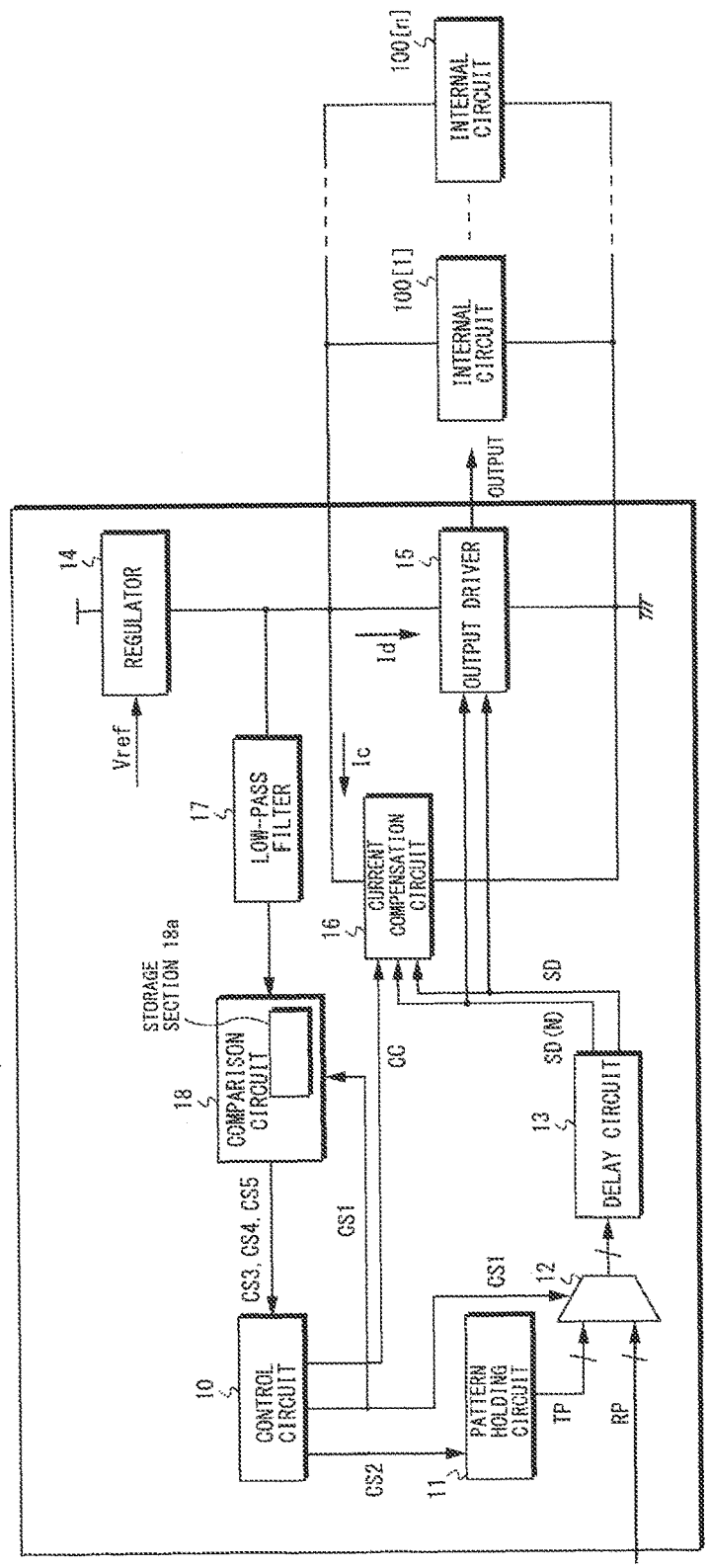
FIG. 1 is a block diagram for illustrating a signal generation device according to an embodiment of the present invention.

Preferred embodiments of the present invention will hereinafter be described with reference to the accompanying drawings. The embodiments to be described below are however cited merely as examples and are not intended to exclude the application of various modifications and techniques not clearly defined below. The present invention can be carried out by modifying in various ways (e.g., by combination of the respective embodiments, etc.) within the scope not departing from the gist thereof. Further, in the description of the following drawings, the same or like parts are illustrated with the same or like reference numerals attached thereto. The drawings are schematically represented and do not necessarily coincide with the actual size and ratio, etc. Parts different in the mutual relation of sizes, and the ratio may be included even between the drawings.

[First Embodiment]

FIG. 1 is a block diagram for describing a signal generation device according to an embodiment of the present invention. As illustrated in this figure, the signal generation device 1 may be configured to include, for example, a control circuit 10, a pattern holding circuit 11, a selector 12, a delay circuit 13, a regulator 14, an output driver 15, a current compensation circuit 16, a low-pass filter 17, and a comparison circuit 18. The signal generation device I may connect each of a plurality of internal circuits 100 [1], . . . , 100[n] and supply a current to them.

The control circuit 10 may be configured to include, for example, a microprocessor, a memory, etc. not shown in the figure, and it may control the entire signal generation device 1. Specifically, the control circuit 10 may output a first control signal CS1 and a second control signal CS2 and receive a third control signal CS3, a fourth control signal CS4, and a fifth control signal CS5. Further, the control circuit 10 may generate a current code CC and output it to the current compensation circuit 16.

The first control signal CS1 may be a signal for controlling the signal generation device 1 so as to operate in either a normal operation mode or a calibration mode, and outputted from the control circuit 10 to the selector 12 and the comparison circuit 18. The second control signal CS2 may be a signal for selecting a predetermined test pattern TP, and outputted from the control circuit 10 to the pattern holding circuit 11. The third control signal CS3, the fourth control signal CS4, and the fifth control signal CS5 each may be signals for performing a predetermined notification from the comparison circuit 18 to the control circuit 10. The details of the current code CC will be described later.

The pattern holding circuit 11 may hold a plurality of different test patterns TP and output one test pattern TP to the selector 12 based on the second control signal CS2 from the control circuit 10. In the present embodiment, the pattern holding circuit 11 may hold test patterns TP (a) and TP (b). The pattern holding circuit 11 may be configured to be able to hold arbitrary test patterns TP. The pattern holding circuit 11 may hold, for example, a clock pattern, a fixed logic pattern, and a pseudo random pattern, etc. as test patterns TP.

The selector 12 may select either one of a predetermined test pattern TP received from the pattern holding circuit 11 and a random pattern RP received from the outside based on the first control signal CS1 from the control circuit 10 and output the one to the delay circuit 13.

The delay circuit 13 may generate data obtained by delaying the predetermined test pattern TP or the random pattern RP received from the selector 12 by N (where N: arbitrary integer) clocks and output the one therefrom. Specifically, the delay circuit 13 may convert the predetermined test pattern TP or the random pattern RP received from the selector 12 from parallel data to serial data SD and thereafter generate delayed serial data SD (N) obtained by delaying the serial data SD by N (where N: arbitrary integer) clocks. The delay circuit 13 may output the serial data SD and the delayed serial data SD (N) to the output driver 15 and the current compensation circuit 16. It is noted that the delay circuit 13 may be configured to generate a plurality of delayed serial data SD (N) different in the number of delayed clocks and output the same.

The regulator 14 may generate a voltage based on a reference voltage Vref received therein and supply the generated voltage to the output driver 15, the internal circuits 100, and the current compensation circuit 16. Further, the regulator 14 may output the generated voltage to the low-pass filter 17.

The output driver 15 may be driven based on the voltage supplied from the regulator 14 to generate serial data subjected to emphasis processing based on the serial data SD and the delayed serial data SD (N) received from the delay circuit 13 and output it to an unillustrated external device. The output driver 15 may be a driver having a voltage mode in which a driver current Id drawn from the regulator 14 changes in according with the serial data SD and the delayed serial data SD (N) received from the delay circuit 13.

The current compensation circuit 16 may be driven by power supply from the regulator 14 to generate a compensation current is based on the serial data SD and the delayed serial data SD (N) received from the delay circuit 13 and the current code CC received from the control circuit 10. The details of the current compensation circuit 16 will be described later.

The low-pass filter 17 may be configured to include, for example, a capacitor (not shown), and it may integrate the output voltage of the regulator 14 and output an averaged value to the comparison circuit 18.

The comparison circuit 18 may receive an average value of an output voltage of the regulator 14 over a first period and an average value of an output voltage of the regulator 14 over a second period from the low-pass filter 17 and compare them with each other. For example, the first period may be a period for performing processing based on the test pattern TP (a) by the output driver 15 and the current compensation circuit 16. The second period may be a period for performing processing based on the test pattern TP (b) by the output driver 15 and the current compensation circuit 16.

Specifically, first, after the comparison circuit 18 have received the first control signal CS1 which selects the calibration mode therein, the comparison circuit 18 may receive, from the low-pass filter 17, the average value of the output voltage of the regulator 14 over the period during which the output driver 15 and the current compensation circuit 16 are performing the processing based on the test pattern TP (a) and digitize it into a first voltage code, and store it in a storage section 18a. After the storage of the first voltage code is completed, the comparison circuit 18 may generate a third control signal CS3 and output it to the control circuit 10. Thus, the control circuit 10 may generate a second control signal CS2 which selects the test pattern TP (b) and output it to the pattern holding circuit 11.

Next, the comparison circuit 18 may receive, from the low-pass filter 17, an average value of an output voltage of the regulator 14 over the period during which the output driver 15 and the current compensation circuit 16 are performing the processing based on the test pattern TP (b), and digitize it into a second voltage code. Then, the comparison circuit 18 may determine a difference value a between the first voltage code and the second voltage code and compare the difference value a with a determination criteria value e. When the difference value a is the determination criteria value e or more, the comparison circuit 18 may generate a fourth control signal CS4 and output it to the control circuit 10. The determination criteria value e may be an upper limit value of the difference value a at which a fluctuation in the output voltage of the regulator 14 can be suppressed in the normal operation mode. Thus, the control circuit 10 may change the current code CC and outputs it to the current compensation circuit 16. On the other hand, when the difference value a is below the determination criteria value e, the comparison circuit 18 may generate a fifth control signal CS5 and outputs it to the control circuit 10. Thus, the control circuit 10 may generate a first control signal CS1 which selects the normal operation mode and output it to the selector 12 and the comparison circuit 18.

FIG. 2 is a block diagram for illustrating the current compensation circuit of the signal generation device according to the embodiment of the present invention. As shown in this figure, the current compensation circuit 16 may be configured to include, for example, a current control signal generator 161, a plurality of transistors 162, and a plurality of switches 163.

The current control signal generator 161 may generate a current control signal CCS based on the serial data SD and the delayed serial data SD (N) from the delay circuit 13. The details of the current control signal generator 161 will be described later.

The transistors 162 may be, for example, NMOSFETs and configure a parallel variable resistor for multi-stage load current adjustments with the current control signal generator 161. That is, the transistors 162 may generate a compensation current Ic flowing so as to be drawn from the regulator 14 to the transistors 162, in accordance with the current control signal CCS generated by the current control signal generator 161, depending on the number thereof to be operated.

Each switch 163 may be arranged between the current control signal generator 161 and a gate terminal of each transistor 162 and ON/OFF-controlled by the current code CC from the control circuit 10.

The current code CC may individually ON/OFF-control the respective switches 163 as described above in accordance with its value. That is, the current code CC may be a code which determines the number of the operated transistors 162 in accordance with its value.

Figure 3A:
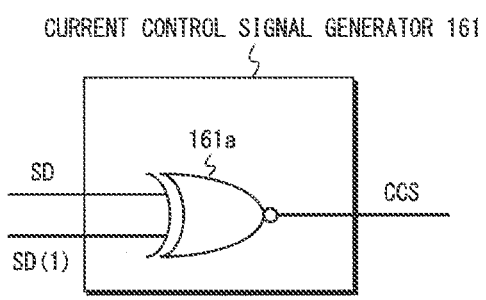
FIG. 3A is a block diagram for illustrating a current control signal generation circuit of a signal generation device according to the first embodiment of the present invention.

FIG. 3A is a block diagram for illustrating the current control signal generation circuit of the signal generation device according to the embodiment of the present invention. As shown in this figure, the current control signal generator 161 may be configured to include a logic circuit 161a, for example. Further, the delayed serial data SD (N) is assumed to be data delayed by one clock with N=1.

Figure 3B:
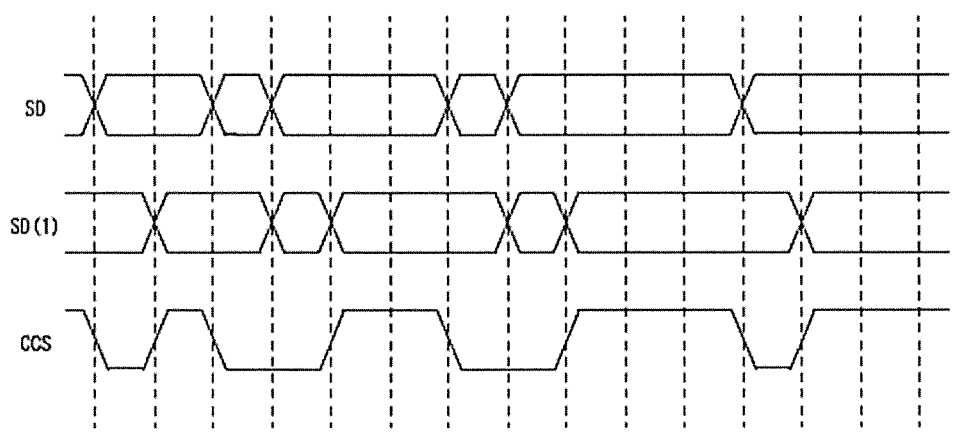
FIG. 3B is a timing chart illustrating operation of a current control signal generation circuit of a signal generation device according to an embodiment of the present invention.

The logic circuit 161a may receive, for example, serial data SD and delayed serial data SD (1), calculate the NOT of EXOR of them, and output the calculation result as a current control signal CCS. For example, when logic transitions of the serial data SD and the delayed serial data SD (1) are performed as shown in FIG. 3B, the logic circuit 161a may output such a current control signal CCS.

Figure 4:
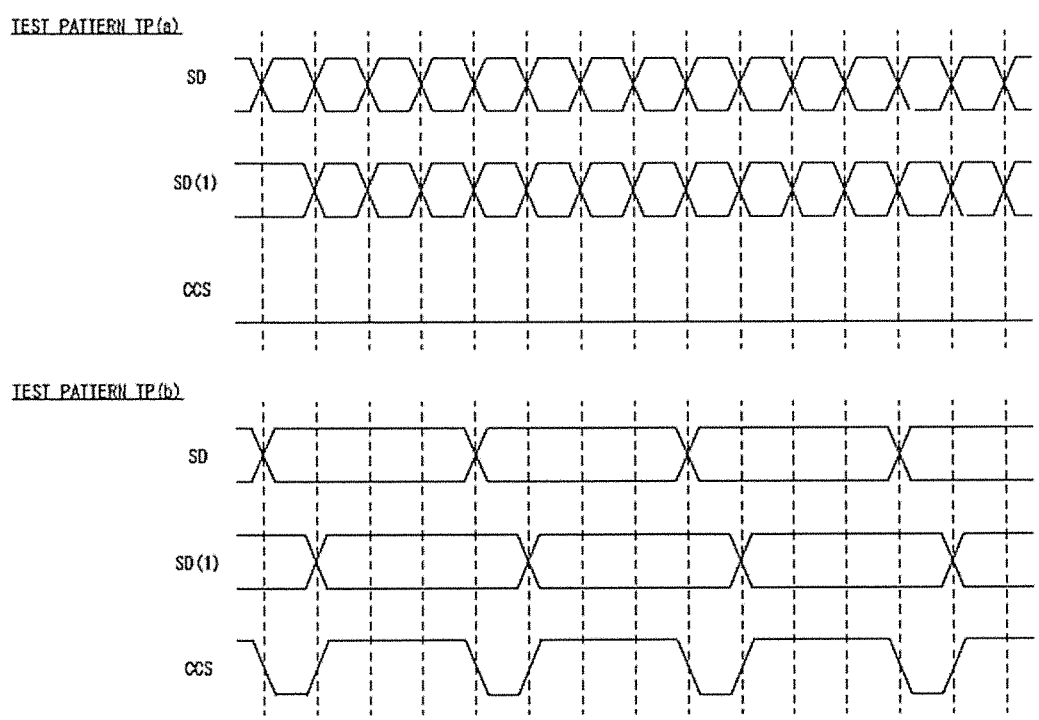
FIG. 4 is a timing chart illustrating a relationship between test patterns and current control signals of a signal generation device according to an embodiment of the present invention.

FIG. 4 is a timing chart illustrating a relationship between test patterns and current control signals of the signal generation device according to the embodiment of the present invention. In this figure, the test patterns TP (a) and TP (b) respectively indicate the serial data. SD and delayed serial data SD (1) generated by the delay circuit 13, and the current control signal CCS generated by the current control signal generator 161.

As shown in this figure, the serial data SD and the delayed serial data SD (1) based on the test pattern TP (a) may be logic-transitioned for each clock. Further, the current control signal CCS may become a signal always indicating "L."

On the other hand, the serial data SD and delayed serial data SD (1) based on the test pattern TP (b) may be logic transitioned every four clocks. Further, the current control signal CCS may become a signal indicating "L" every four clocks and indicating "H" otherwise.

It is noted that the test pattern TP (a) may be a pattern for testing a fluctuation in the output voltage of the regulator 14 in a case where the number of logic transitions is large. The test pattern TP (b) may be a pattern for testing a fluctuation in the output voltage of the regulator 14 in a case where the number of logic transitions is small.

Figure 5:
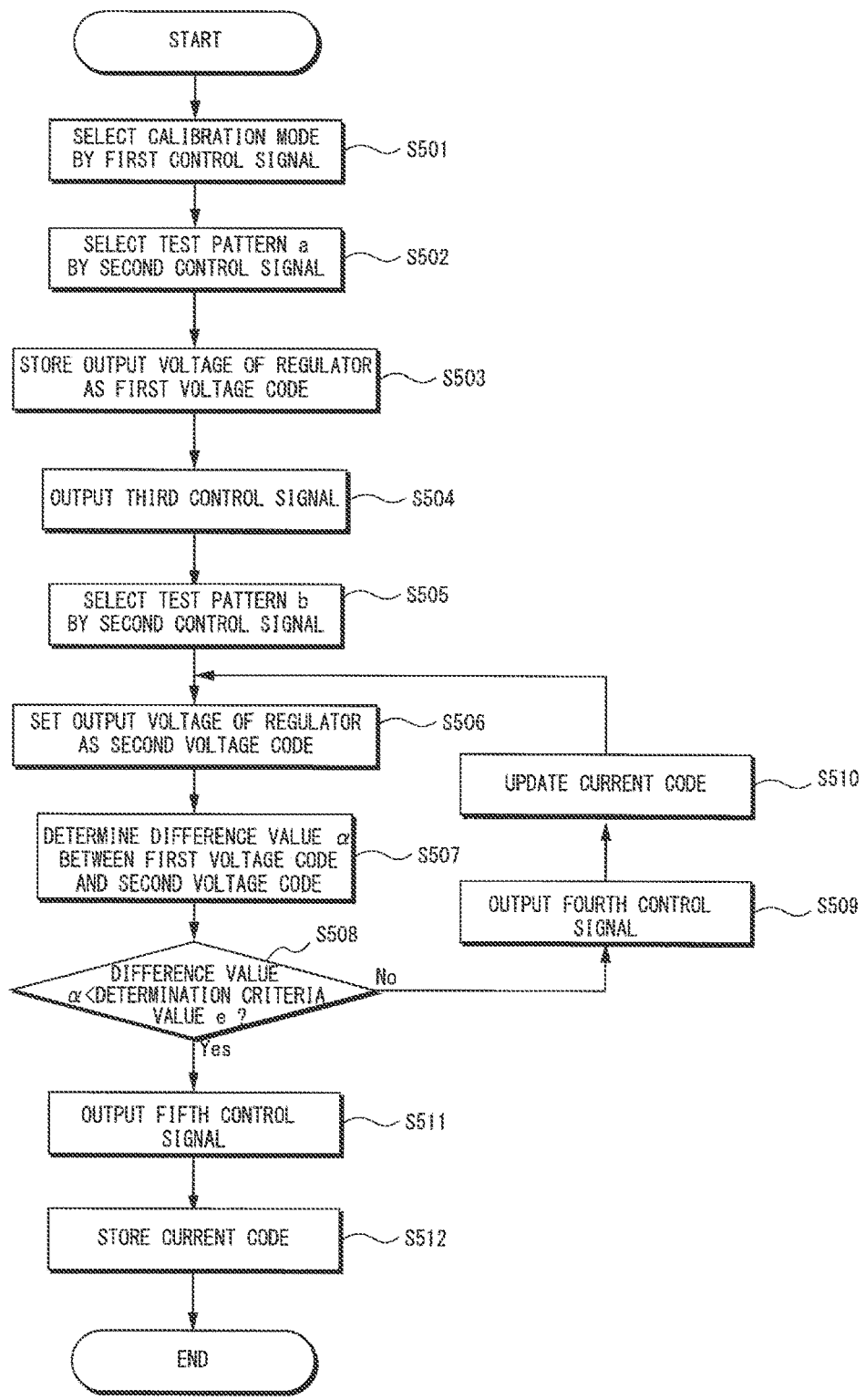
FIG. 5 is a flowchart illustrating a method for suppressing a fluctuation in an output voltage of a regulator according to an embodiment of the present invention.

FIG. 5 is a flowchart illustrating a method for suppressing a fluctuation in the output voltage of the regulator according to the embodiment of the present invention. Such a method for suppressing a fluctuation in the output voltage of the regulator may be executed in calibration of the signal generation device 1.

As shown in this figure, after the startup of the signal generation device 1, the control circuit 10 may output a first control signal CS1 selecting a calibration mode to the selector 12 and the comparison circuit 18 and output a current code CC set to an initial value to the current compensation circuit 16 (S501). Thus, the selector 12 may select a test pattern TP (a) or TP (b) outputted from the pattern holding circuit 11 and output it to the delay circuit 13. The comparison circuit 18 may receive the averaged value of the output voltage of the regulator 14 from the low-pass filter 17. The current compensation circuit 16 may set the number of transistors 162 operated in correspondence with the current code CC being the initial value.

Subsequently, the control circuit 10 may generate a second control signal CS2 selecting the test pattern TP (a) and output it to the pattern holding circuit 11 (S502). Thus, the pattern holding circuit 11 may output the test pattern TP (a). The delay circuit 13 may output serial data SD generated by converting the test pattern TP (a) received through the selector 12 from parallel data to serial data, and delay serial data SD (N) generated by delaying the serial data SD by N clocks to the output driver 15 and the current compensation circuit 16. The output driver 15 may generate a signal, based on the serial data SD and the delayed serial data SD (N) and output it to the unillustrated external device. On the other hand, the current compensation circuit 16 may generate a current control signal CCS, based on the serial data SD and the delayed serial data SD (N) and generate a compensation current Ic in accordance with the current control signal CCS, depending on the number of the transistors 162 connected in accordance with the current code CC. It is noted that the current control signal CSS based on the test pattern TP (a) may always be "L" as described with reference to FIG. 4. In this case, since the value of the current control signal CCS becomes 0, the value of the compensation current Ic may be 0.

Subsequently, the comparison circuit 18 may receive, from the low-pass filter 17, the average value of the output voltage of the regulator 14 over a period during which the output driver 15 and the current compensation circuit 16 are performing processing based on the test pattern TP (a) and digitize it into a first voltage code, and then store it in the storage section 18a (S503). After the storage of the first voltage code is completed, the comparison circuit 18 may generate a third control signal CS3 and output it to the control circuit 10 (S504).

The control circuit 10 may generate a second control signal CS2 selecting the test pattern TP (b) by receiving the third control signal CS3 and output it to the pattern holding circuit 11 (S505). Thus, since the pattern holding circuit 11 may output the test pattern TP (b), the delay circuit 13, the output driver 15, and the current compensation circuit 16 may perform processing similar to the above based on the test pattern TP (b).

Subsequently, the comparison circuit 18 may receive, from the low-pass filter 17, the average value of the output voltage of the regulator 14 over a period during which the output driver 15 and the current compensation circuit 16 are performing processing based on the test pattern TP (b) and digitize the same into a second voltage code (S506). Then, the comparison circuit 18 may determine a difference value a between the first voltage code and the second voltage code (S507).

Following the above, the comparison circuit 18 may determine whether the difference value α is equal to or smaller than a determination criteria value e (S508). When the difference value α is greater than the determination criteria value e (No in S508), the comparison circuit 18 may generate a fourth control signal CS4 and output it to the control circuit 10 (S509). The control circuit 10 may change the value of the current code CC by receiving the fourth control signal CS4 (S510). Thus, since the number of the transistors 162 to be operated may be changed, the value of the compensation current Ic generated by the current compensation circuit 16 may be changed based on the test pattern TP (b).

On the other hand, when the difference value α determined in S507 is less than the determination criteria value e (Yes in S508), the comparison circuit 18 may generate a fifth control signal CS5 and output it to the control circuit 10 (S511). The control circuit 10 may store the value of the current code CC at the present time by receiving the fifth control signal CS5 (S512). Thus, the calibration of the signal generation device 1 may be completed. Thereafter, the control circuit 10 may output a first control signal CS1 selecting the normal operation mode to the selector 12 and the comparison circuit 18 and output the current code CC having the value stored in S512 to the current compensation circuit 16. By this, the signal generation device 1 may be operated in the normal operation mode and in a state in which the fluctuation in the output voltage generated in the regulator 14 is suppressed.

Figure 6:
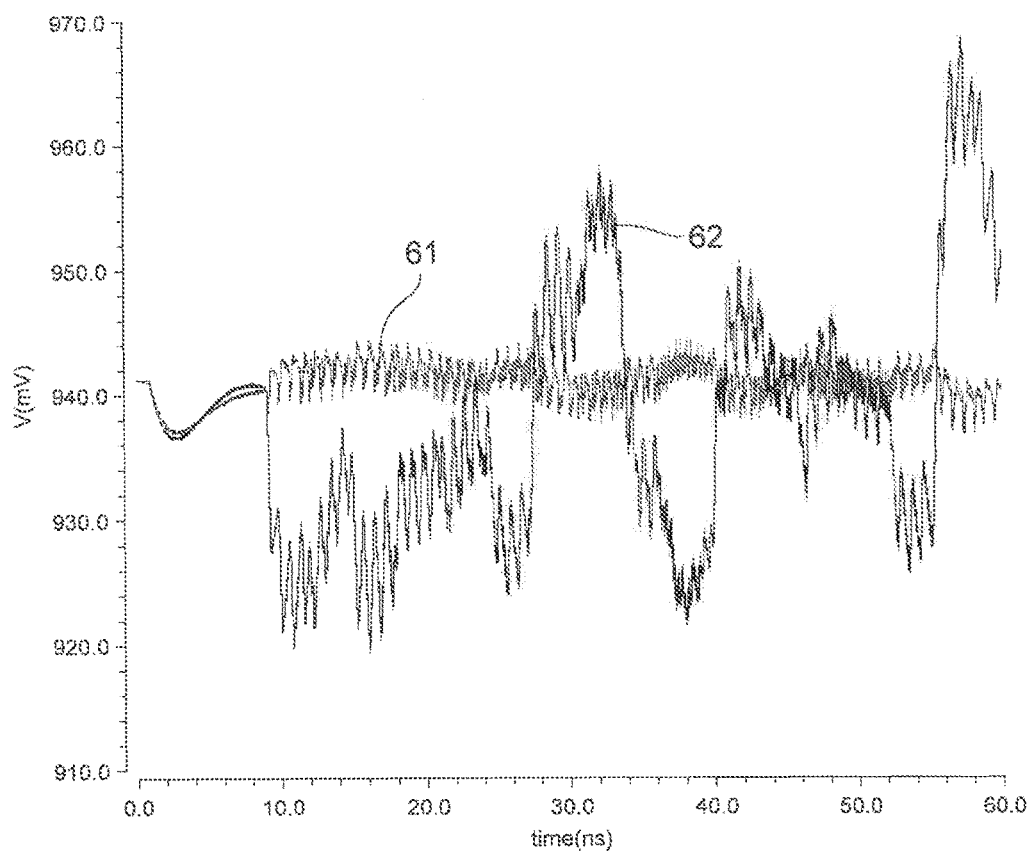
FIG. 6 is a diagram illustrating results of simulation performed to confirm a effect of calibration in a signal generation device according to an embodiment of the present invention.

FIG. 6 is a diagram illustrating results of simulation performed to confirm the effect of calibration in the signal generation device according to the embodiment of the present invention. Specifically, they are for evaluating the fluctuation in the output voltage of the regulator 14 when the signal generation device 1 is operated in the normal operation mode. In this figure, a solid line 61 indicates a simulation result where the calibration of the signal generation device 1 is executed in advance, whereas a solid line 62 indicates a simulation result where the calibration of the signal generation device 1 is not executed in advance.

As is apparent from this figure, the fluctuation in the output voltage of the regulator 14 is drastically suppressed by executing the calibration of the signal generation device 1 in advance.

[Second Embodiment]

Figure 7:
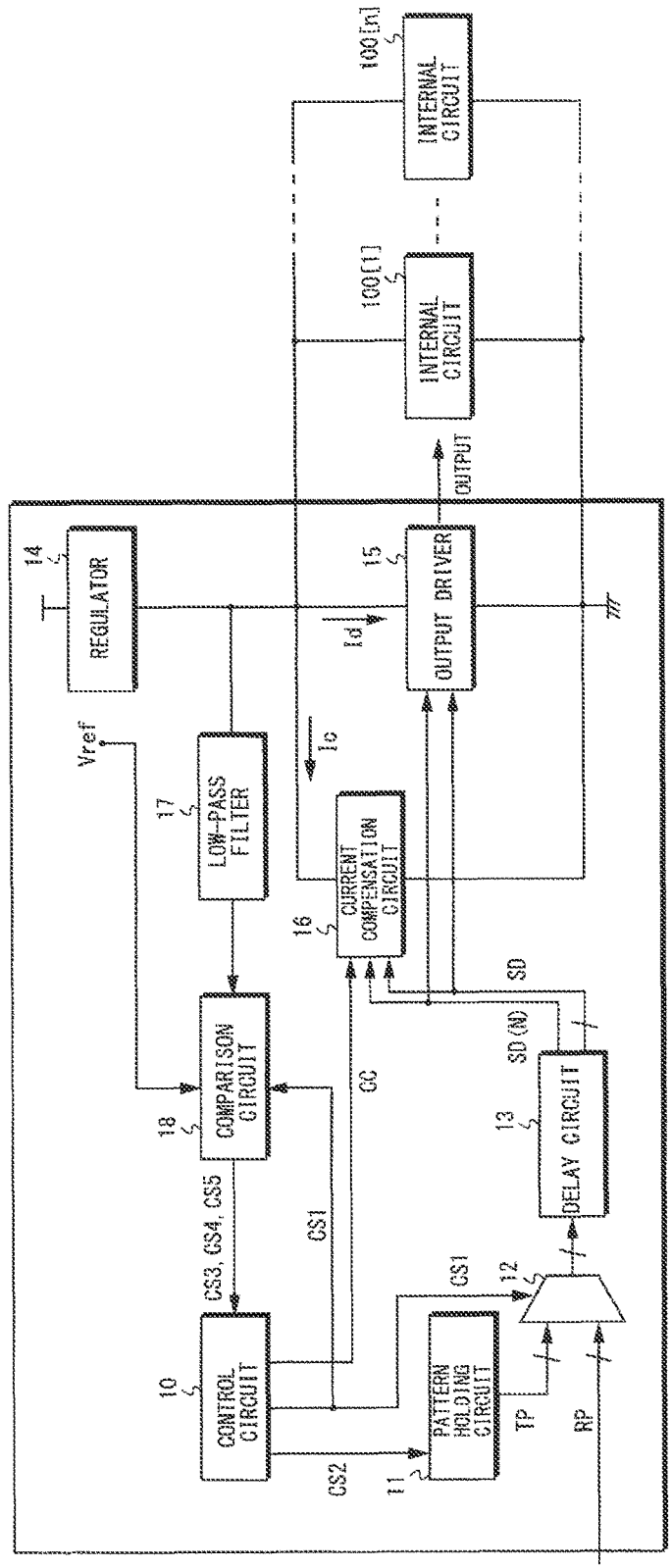
FIG. 7 is a block diagram for illustrating a signal generation device according to an embodiment of the present invention.

FIG. 7 is a block diagram for illustrating a signal generation device according to an embodiment of the present invention. As shown in this figure, the signal generation device 2 may be different from the above-described signal generation device 1, and a comparison circuit 18 may receive a reference voltage Vref instead of the comparison circuit 18 receiving the average value of the output voltage of the regulator 14 based on the test pattern TP (a). The comparison circuit 18 may digitize the value of the reference voltage Vref into a first voltage code and perform a comparison thereof with a second voltage code.

The signal generation device 2 may have a merit that since the storage section 18a becomes unnecessary and the test pattern TP (a) is not required to be used, the configuration related to the calibration and its operation can be simplified.

The signal generation device 2 may be configured in such a manner that the comparison circuit 18 receives a voltage having a predetermined value instead of the reference voltage Vref.

[Third Embodiment]

Figure 8:
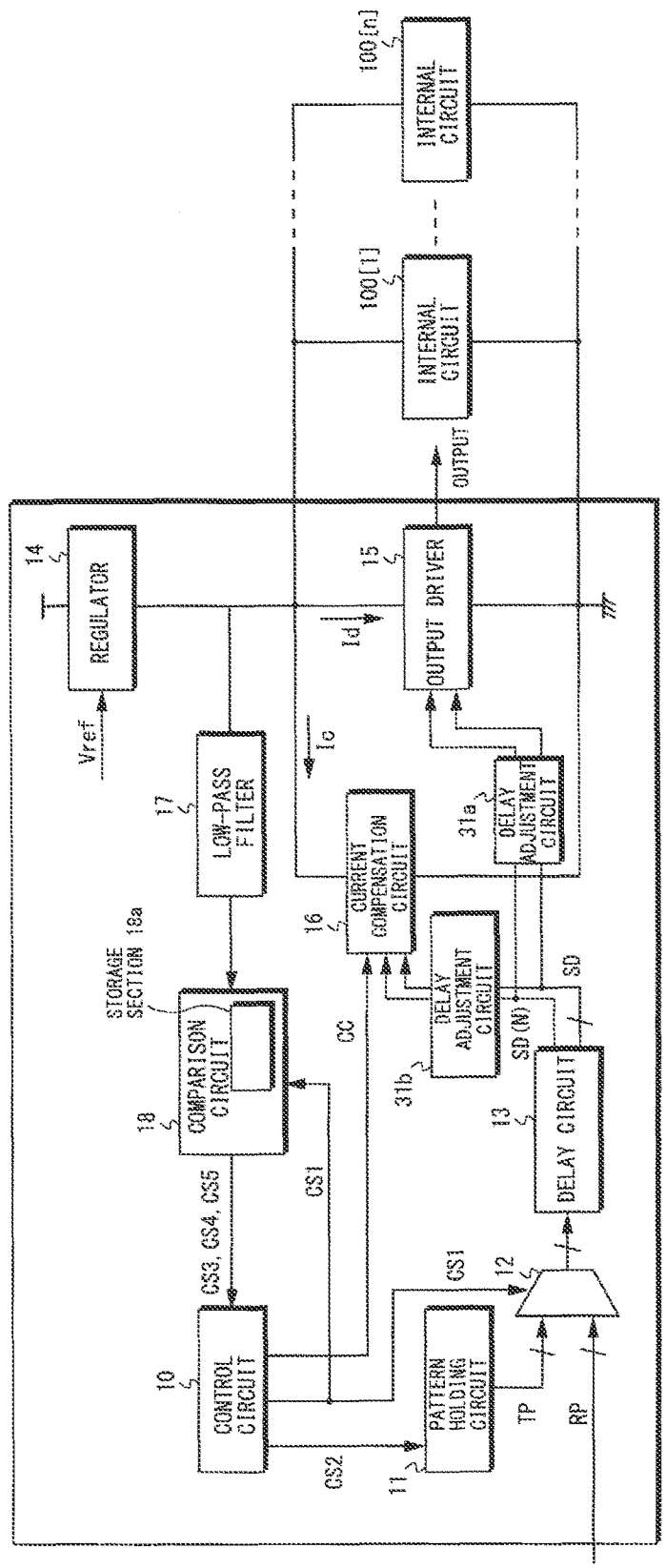
FIG. 8 is a block diagram for illustrating a signal generation device according to an embodiment of the present invention.

FIG. 8 is a block diagram for illustrating a signal generation device according to an embodiment of the present invention. As shown in this figure, the signal generation device 3 may be provided with a delay adjustment circuit 31a and a delay adjustment circuit 31b in addition to the above-described signal generation device 1.

The delay adjustment circuit 31a may receive serial data SD and delayed serial data SD (N) from a delay circuit 13, delay them by a predetermined clock, and output them to an output driver 15. The delay adjustment circuit 31b may receive the serial data SD and the delayed serial data SD (N) from the delay circuit 13, delay them by a predetermined clock, and output them to a current compensation circuit 16.

In the signal generation device 3, the delay adjustment circuits 31a and 31b may be used to correct a difference in internal processing speed between the output driver 15 and the current compensation circuit 16. Specifically, in the signal generation device 3, the delay adjustment circuits 31a and 31b may adjust delay amounts in addition to the serial data SD and the delayed serial data SD (N) in accordance with the difference in the internal processing speed between the output driver 15 and the current compensation circuit 16. Thus, since a compensation current Ic can be generated in more appropriate timing, the signal generation device 3 may more reliably suppress a fluctuation in the output voltage of a regulator 14.

[Fourth Embodiment]

Figure 9A:
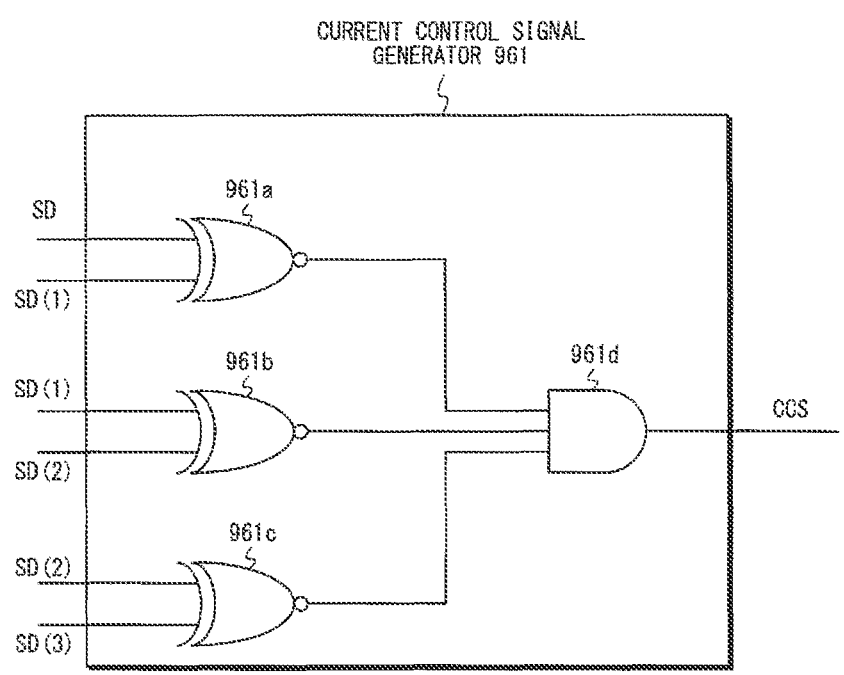
FIG. 9A is a block diagram for illustrating a current control signal generation circuit of a signal generation device according to an embodiment of the present invention.

FIG. 9A is a block diagram for illustrating a current control signal generation circuit of a signal generation device according to an embodiment of the present invention. As shown in this figure, the current control signal generator 961 may be configured by, for example, logic circuits 961a, 961b, 961c, and 961d and be used instead of the current control signal generator 161 shown in FIG. 2.

The logic circuits 961a, 961b, and 961c each may calculate the NOT of EXOREXOR of two pieces of data received therein and output a result of the calculation to the logic circuit 961d. Specific examples will be described using data delayed by 1, 2, and 3 clocks, respectively. The logic circuit 961a may receive serial data SD and delayed serial data SD (1) therein, the logic circuit 961b may receive the delayed serial data SD (1) and delayed serial data SD (2) therein, and the logic circuit 961c may receive the delayed serial data SD (2) and delayed serial data SD (3) therein.

The logic circuit 961d may calculate a logical product of data received from the logic circuits 961a, 961b, and 961c. The logic circuit 961d may then output a result of the calculation as a current control signal CCS.

Figure 9B:
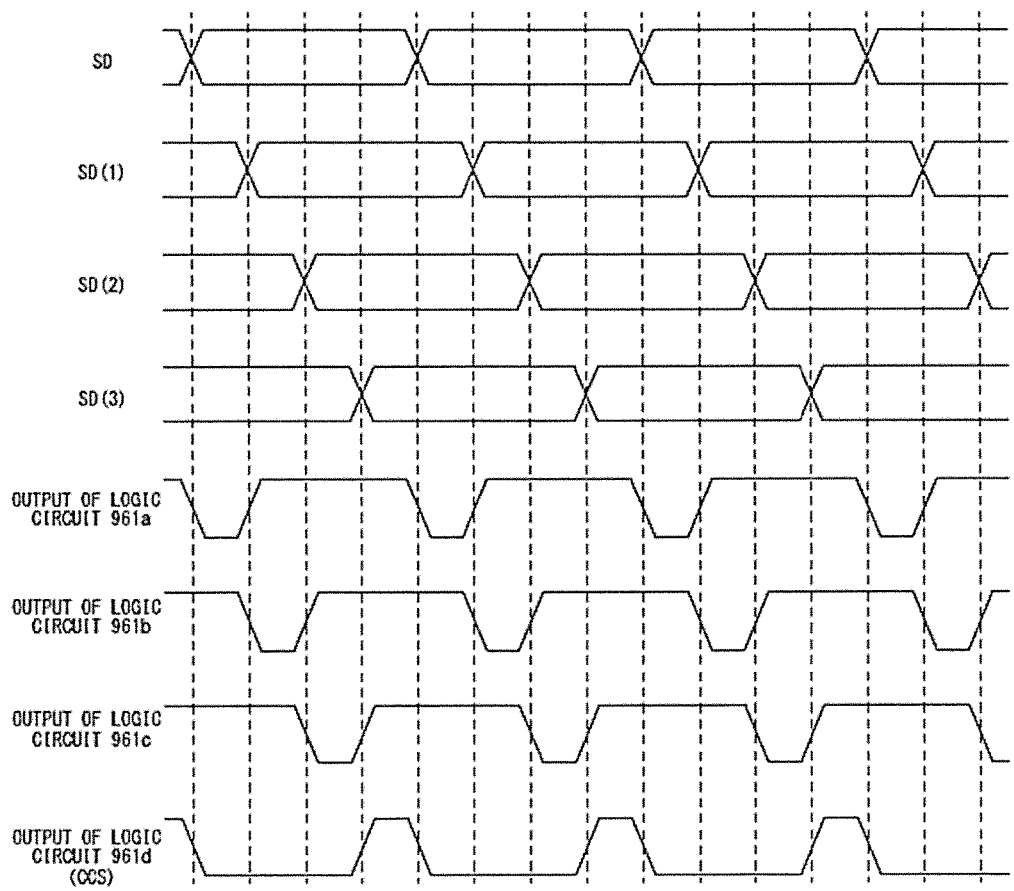
FIG. 9B is a timing chart illustrating operation of a current control signal generation circuit of a signal generation device according to an embodiment of the present invention.

For example, when logic transitions of such serial data SD and delayed serial data SD (1), SD (2), and SD (3) as shown in FIG. 9B are performed, the outputs of the logic circuits 961a, 961b, 961c, and 961d may be as shown in this figure.

With the current control signal generator 961 having the above-described configuration, the generation timing of a compensation current Ic and an average current can be made more appropriate when a signal is outputted to an unillustrated external device based on a random pattern RP in which a logic-transition free state is continued, in the signal generation device 1 operated in a normal operation mode. Accordingly, the signal generation device 1 using the current control signal generator 961 may suppress a fluctuation in the output of a regulator 14 with higher accuracy.

It is noted that the current control signal generator 961 may be configured to comprise more logic circuits each of which calculates the NOT of EXOR of two pieces of data received therein and to calculate a logical product of data outputted from them by the logic circuit 961d. For example, in a case where the current control signal generator 961 comprise n logic circuits each of which calculates the NOT of EXOR of two pieces of data received therein, the first logic circuit may be configured to receive the serial data SD and the delayed serial data SD (1), and the second logic circuit may be configured to receive the delayed serial data SD (1) and the delayed serial data SD (2). Subsequent cases are also similar. The nth logic circuit may be configured to receive delayed serial data SD (n−1) and delayed serial data SD (u).

[Fifth Embodiment]

Figure 10A:
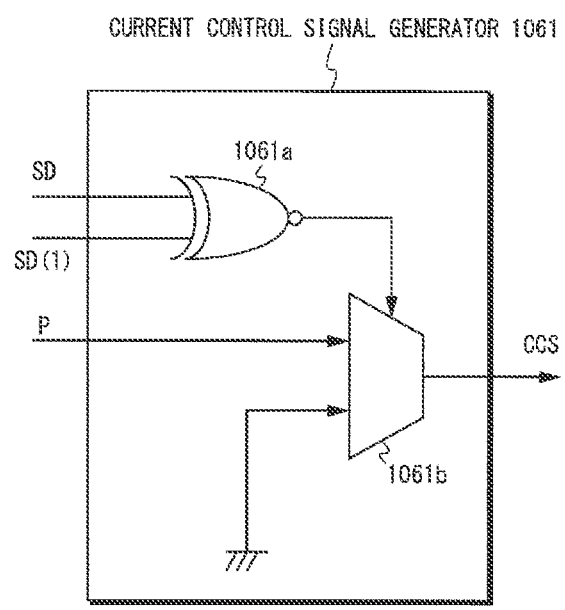
FIG. 10A is a block diagram for illustrating a current control signal generation circuit of a signal generation device according to an embodiment of the present invention.

FIG. 10A is a block diagram for illustrating a current control signal generation circuit of a signal generation device according to an embodiment of the present invention. As shown in this figure, the current control signal generation circuit 1061 may be configured by, for example, a logic circuit 1061a and a selector 1061b and used instead of the current control signal generator 161 shown in FIG. 2.

The logic circuit 1061a may receive serial data SD and delayed serial data SD (1) therein, calculate the NOT of EXOR of them, and output a result of the calculation to the selector 1061b.

The selector 1061b may receive an arbitrary pattern P from one of input terminals and grounds the other thereof. The selector 1061b may select either one of the arbitrary pattern P and the ground potential based on the output of the logic circuit 1061a, and output the same as a current control signal CCS.

Figure 10B:
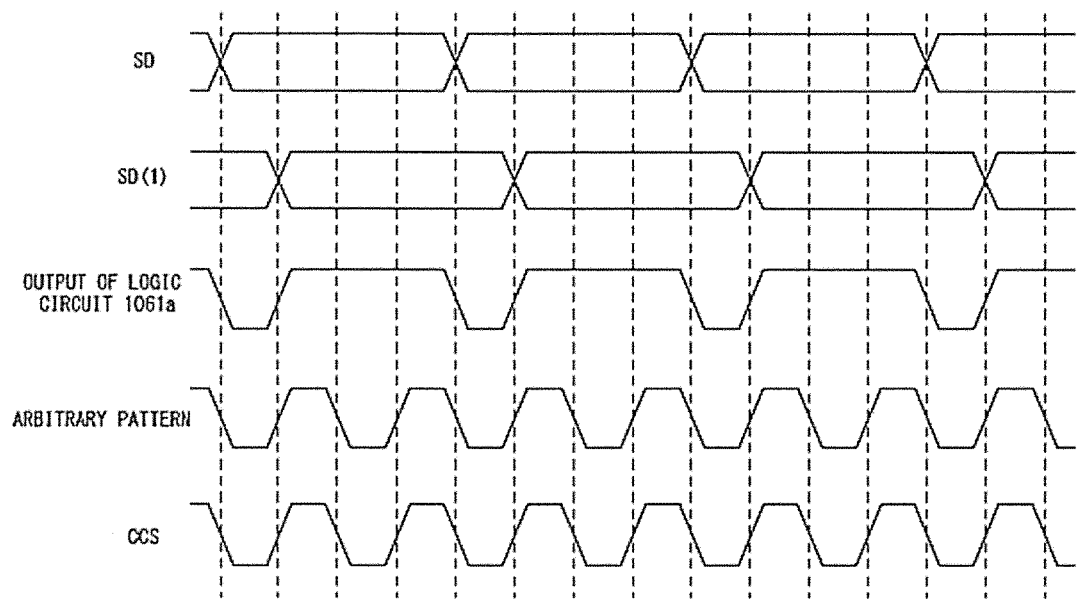
FIG. 10B is a timing chart illustrating operation of a current control signal generation circuit of a signal generation device according to an embodiment of the present invention.

For example, if logic transitions of such serial data SD and delayed serial data SD (1) as shown in FIG. 10B are performed and the arbitrary pattern P whose logic is transitioned for each clock such as shown in this same figure is inputted to one of the input terminals of the selector 1061b, the outputs of the logic circuit 1061a and the selector 1061b may be as shown in this figure.

With the above-described configuration, the current control signal generation circuit 1061 may change the current control signal CCS in accordance with the arbitrary pattern P. Therefore, the current control signal generation circuit 1061 may allow the accuracy of a compensation current Ic to be improved by setting an arbitrary pattern P corresponding to a random pattern RP in the signal generation device 1 in a normal operation mode. Thus, the signal generation device 1 which uses the current control signal generation circuit 1061 may allow a fluctuation in the output of a regulator 14 with higher accuracy to be suppressed.

The embodiments are illustrations for illustrating the present invention. It is not ended to limit the present invention only to these embodiments. The present invention can be carried out in various forms unless departing from the spirit of the present invention.

For example, in the method disclosed in the present specification, unless no inconsistency occurs in the results by the method, the steps, operations or functions may be executed in parallel or different order. The described steps, operations, and functions are provided as mere examples. Some of the steps, operations, and functions may be omitted within the scope not departing from the gist of the invention. Also, they may be combined with each other into one. Further, other steps, operations or functions may be added.

Further, although the various embodiments have been disclosed in the present specification, the specific feature (technical matter) in one embodiment may be added to the other embodiment while improving it as appropriate. Alternatively, it may be replaced with a specific feature in the other embodiment. Such a form is also included in the gist of the present invention.

The present invention is capable of being widely used in the field of an electronic device equipped with a signal generation device.

What is claimed is:

1. A signal generation device for outputting a signal based on a predetermined pattern with a logic transition to a predetermined external device, comprising:
    an output driver which outputs respective signals based on at least two test patterns different in a frequency of the logic transition respectively to the predetermined external device;
    a regulator which supplies power to the output driver;
    a current compensation circuit which generates a compensation current; and
    a control circuit which adjusts a value of the compensation current,
    wherein the control circuit adjusts, for each test pattern, the value of the compensation current such that a difference value calculated based on output voltages of the regulator becomes equal to or less than a determination criteria value.

2. The signal generation device according to claim 1, wherein the control circuit determines a value of a current code based on the difference value, and
    wherein the current compensation circuit generates a current control signal for each test pattern and changes the current control signal in accordance with the value of the current code to adjust the value of the compensation current.

3. The signal generation device according to claim 2, further comprising:
    a low-pass filter, which determines, for each test pattern, an average value of the output voltages of the regulator over periods during which the signals based on the test patterns are outputted by the output driver, and
    a comparison circuit, which calculates the difference value and compares the difference value and the determination criteria value, the difference value being a difference between two of the average values of the output voltages of the regulator for the at least two test patterns,
    wherein the control circuit changes the value of the current code when the difference value exceeds the determination criteria value in the comparison circuit.

4. The signal generation device according to claim 2, further comprising:
    a delay circuit which delays each of the test patterns by a predetermined clock to generate a delayed test pattern,
    wherein the current compensation circuit generates the current control signal based on the test pattern and the delayed test pattern, and
    wherein the output driver generates a signal outputted to the predetermined external device based on the test pattern and the delayed test pattern.

5. The signal generation device according to claim 4, wherein the current compensation circuit determines the NOT of EXOR of the test pattern and the delayed test pattern to generate the current control signal.

6. The signal generation device according to claim 2, further comprising:
    a delay circuit which delays each of the test patterns by a predetermined clock to generate a delayed test pattern,
    wherein the delay circuit generates a plurality of the delayed test patterns different in a number of delay clocks,
    wherein the current compensation circuit generates the current Control signal, based on the test pattern and a plurality of the delayed test patterns, and
    wherein the output driver generates a signal outputted to the predetermined external device based on the test pattern and the delayed test pattern.

7. The signal generation device according to claim 2, further comprising a delay circuit which delays the test pattern by a predetermined clock to generate a delayed test pattern,
    wherein the current compensation circuit generates the current control signal, based on the test pattern, the delayed test pattern, and an arbitrary pattern in which a logic transition is arbitrarily performed, and
    wherein the output driver generates a signal outputted to the predetermined external device based on the test pattern and the delayed test pattern.

8. The signal generation device according to claim 4, further comprising a delay adjustment circuit which adjusts delayed amounts of time of the test pattern and the delayed test pattern received by the output driver and the current compensation circuit respectively,
  wherein the delay adjustment circuit adjusts the delayed amounts of time of the test pattern and the delayed test pattern so as to correct a difference in internal processing speed between the output driver and the current compensation circuit.

9. A signal generation device for outputting a signal based on a predetermined pattern with a logic transition to a predetermined external device, comprising:
  an output driver which outputs a signal based on a test pattern to the predetermined external device;
  a regulator which supplies power to the output driver;
  a current compensation circuit which generates a compensation current; and
  a comparison circuit which compares a difference value between a calculated value of output voltage and a predetermined reference voltage with a determination criteria value,
  wherein a value of an output voltage of the regulator is determined, and a value of the compensation current is adjusted such that the difference value becomes equal to or less than the determination criteria value.

10. A method for controlling an output voltage of a regulator supplying power to an output driver of a signal generation device which outputs a signal based on a predetermined pattern with a logic transition to a predetermined external device, the method comprising:
  outputting respective signals based on at least two test patterns different in a frequency of the logic transition respectively from the output driver to the predetermined external device;
  calculating output voltages of the regulator for each of test patterns; and
  adjusting a value of a compensation current generated by a current compensation circuit such that a difference value based on the calculated output voltages becomes equal to or less than a determination criteria value.

11. The method according to claim 10, wherein the adjusting includes:
  determining a value of a current code based on the difference value, and
  generating a current control signal for each of the test patterns and adjusting the value of the compensation current by changing the current control signal in accordance with the value of the current code.

12. The method according to claim 11,
  wherein the calculating includes determining, for each of test patterns, average values of the output voltages of the regulator over periods during which the signals based on the test patterns are outputted by the output driver, and
  wherein the adjusting step includes determining a difference between two of the average values to calculate the difference value and comparing the difference value and the determination criteria value.

13. The method according to claim 11,
  wherein the calculating includes outputting the respective signals based on the test pattern and a delayed test pattern obtained by delaying the test pattern by a predetermined clock respectively from the output driver to the predetermined external device, and
  wherein the adjusting includes generating the current control signal, based on the test pattern and the delayed test pattern.

14. The method according to claim 13, wherein the adjusting includes determining the NOT of EXOR of the test pattern and the delayed test pattern to generate the current control signal.

* * * * *